United States Patent
Wan et al.

(10) Patent No.: US 10,651,425 B2
(45) Date of Patent: May 12, 2020

(54) ORGANIC LIGHT-EMITTING DIODE AND DISPLAY DEVICE

(71) Applicants: BOE TECHNOLOGY GROUP CO., LTD., Beijing (CN); HEFEI XINSHENG OPTOELECTRONICS TECHNOLOGY CO., LTD., Hefei, Anhui (CN)

(72) Inventors: Xiang Wan, Beijing (CN); Wenbin Jia, Beijing (CN); Rui Peng, Beijing (CN)

(73) Assignees: BOE TECHNOLOGY GROUP CO., LTD., Beijing (CN); HEFEI XINSHENG OPTOELECTRONICS TECHNOLOGY CO., LTD., Hefei, Anhui (CN)

(*) Notice: Subject to any disclaimer, the term of this patent is extended or adjusted under 35 U.S.C. 154(b) by 205 days.

(21) Appl. No.: 15/744,255

(22) PCT Filed: Jun. 30, 2017

(86) PCT No.: PCT/CN2017/091108
§ 371 (c)(1),
(2) Date: Jan. 12, 2018

(87) PCT Pub. No.: WO2018/120712
PCT Pub. Date: Jul. 5, 2018

(65) Prior Publication Data
US 2019/0006629 A1    Jan. 3, 2019

(30) Foreign Application Priority Data
Dec. 28, 2016 (CN) .......................... 2016 1 1239420

(51) Int. Cl.
*H01L 51/52* (2006.01)
*H01L 27/32* (2006.01)

(52) U.S. Cl.
CPC ...... *H01L 51/5275* (2013.01); *H01L 51/5206* (2013.01); *H01L 51/5221* (2013.01); *H01L 27/3246* (2013.01); *H01L 51/5234* (2013.01)

(58) Field of Classification Search
CPC ............. H01L 51/5275; H01L 51/5206; H01L 51/5221
See application file for complete search history.

(56) References Cited

U.S. PATENT DOCUMENTS

2014/0131679 A1    5/2014    Lee et al.

FOREIGN PATENT DOCUMENTS

| CN | 103887438 A | 6/2014 |
| CN | 105226203 A | 1/2016 |
| CN | 106856229 A | 6/2017 |

OTHER PUBLICATIONS

The International Search Report and Written Opinion dated Oct. 11, 2017; PCT/CN2017/091108.

*Primary Examiner* — Douglas M Menz

(57) ABSTRACT

An organic light-emitting diode and a display device are disclosed. The organic light-emitting diode includes an organic light-emitting layer and a first light ray adjusting layer, wherein the organic light-emitting layer is configured to generate at least first incident light and second light to enter the first light ray adjusting layer to form a first refracted light ray and a second refracted light ray respectively, and a refraction angle of the first refracted light ray is smaller than a refraction angle of the first refracted light ray. A first refractive index of the first light ray adjusting layer on a propagation path of the second refracted light ray is greater than that of the first light ray adjusting layer on a propagation path of the first refracted light ray.

14 Claims, 5 Drawing Sheets

ORGANIC LIGHT-EMITTING DIODE AND DISPLAY DEVICE

TECHNICAL FIELD

The embodiments of the present disclosure relate to an organic light-emitting diode and a display device

BACKGROUND

OLED (organic light-emitting diode) has become a next generation of flat panel display technology after the LCD (liquid crystal display), due to characteristics such as all-solid state, self-luminous, high contrast, wide viewing angle etc.

The OLED includes a transparent anode, an organic light-emitting layer and a metal cathode. When appropriate voltages are respectively applied to the anode and the cathode, holes of the cathode and charges of the anode are combined in the organic light-emitting layer to generate light. Depending on the composition of the organic light-emitting layer, light of the three primary colors red, green and blue can be produced, thereby forming light of basic colors.

SUMMARY

An embodiment of the present disclosure provides an organic light-emitting diode (OLED), including: an organic light-emitting layer and a first light ray adjusting layer, wherein the organic light-emitting layer is configured to generate at least a first incident light ray and a second incident light ray into the first light ray adjusting layer to form a first refracted light ray and a second refracted light ray respectively, a refraction angle of the first refracted light ray is smaller than that of the second refracted light ray, a first refractive index of the first light ray adjusting layer on a propagation path of the second refracted light ray is greater than that of the first light ray adjusting layer on a propagation path of the first refracted light ray.

In an example, the first light ray adjusting layer is an anisotropic layer.

In an example, the OLED further includes: a first electrode and a second electrode, wherein the organic light-emitting layer is located between the first electrode and the second electrode.

In an example, the first light ray adjusting layer is located on a side of the first electrode facing away from the organic light-emitting layer.

In an example, the first light ray adjusting layer is located between the first electrode and the organic light-emitting layer.

In an example, the OLED further includes: a pixel defining layer configured to define a light-emitting area of the organic light-emitting layer, wherein the first light ray adjusting layer is provided with a first opening, and the first opening overlaps a central region of a light-emitting area of the organic light-emitting layer.

In an example, an orthographic projection of the first light ray adjusting layer on the first electrode coincides with an orthographic projection of the pixel defining layer on the first electrode.

In an example, the OLED further includes a second light ray adjusting layer, wherein the organic light-emitting layer is configured to generate at least a third incident light ray and a fourth incident light ray into the second light ray adjusting layer to form a third refracted light ray and a fourth refracted light ray respectively, a refraction angle of the third refracted light ray is smaller than that of the fourth refracted light ray, and a second refractive index of the second light ray adjusting layer on a propagation path of the fourth refracted light ray is greater than that of the second light ray adjusting layer on a propagation path of the third refracted light ray.

In an example, the second light ray adjusting layer is an anisotropic layer.

In an example, the second light ray adjusting layer is located between the second electrode and the organic light-emitting layer.

In an example, the second light ray adjusting layer is located on a side of the second electrode facing away from the organic light-emitting layer.

In an example, the second light ray adjusting layer is provided with a second opening, the second opening overlaps a central region of a light-emitting area of the organic light-emitting layer.

In an example, an orthographic projection of the second light ray adjusting layer on the first electrode coincides with an orthographic projection of the pixel defining layer on the first electrode.

In an example, one of the first electrode and the second electrode is a transparent anode, and the other of the first electrode and the second electrode is a light shielding cathode.

In an example, both the first electrode and the second electrode are made of a transparent material.

In an example, the first light ray adjusting layer has a thickness of 500 Å to 1000 Å.

In an example, the first refraction angle and the second refraction angle range from 0° to 45°.

In an example, the first refractive index of the first light adjusting layer ranges from 1.5 to 1.9.

In an example, the central region of the light-emitting area of the organic light-emitting layer is a geometric center of the light-emitting area of the organic light-emitting layer.

An embodiment of the present disclosure provides a display device including any one of the above-mentioned OLEDs.

BRIEF DESCRIPTION OF THE DRAWINGS

In order to clearly illustrate the technical solution of the embodiments of the disclosure, the drawings of the embodiments will be briefly described in the following; it is obvious that the described drawings are only related to some embodiments of the disclosure and thus are not limitative of the disclosure.

The drawings described herein are used to provide a further understanding of the present disclosure and constitute a part of the disclosure. The schematic embodiments of the disclosure and the descriptions thereof are used to explain the disclosure, and do not constitute improper limitations to the disclosure. In the drawings.

DETAILED DESCRIPTION

In order to make objects, technical details and advantages of the embodiments of the disclosure apparent, the technical solutions of the embodiments will be described in a clearly and fully understandable way in connection with the drawings related to the embodiments of the disclosure. Apparently, the described embodiments are just a part but not all of the embodiments of the disclosure. Based on the described embodiments herein, those skilled in the art can obtain other embodiment(s), without any inventive work, which should be within the scope of the disclosure.

In order to increase color temperature of light, light intensity of blue light with a refraction angle $\theta$ of 0° generated from a blue OLED is made to be strongest. The refraction angle $\theta$ is an angle formed by a refracted light propagating in a medium layer and a normal line of a surface where the medium layer is located. As the refraction angle $\theta$ increases, an optical cavity length of the blue light propagating in the medium layer decreases to be cos $\theta$ times the optical cavity length where the refraction angle $\theta$ is equal to 0°, so that the light intensity of the blue light rapidly decreases, thereby causing the OLED device to produce a serious color cast. The greater the refraction angle $\theta$ is, the smaller cos $\theta$ is, and the more serious the color cast is.

To facilitate understanding, the OLED provided by the embodiments of the present disclosure and the display device using the same will be described in detail below with reference to the accompanying drawings.

First Embodiment

Figure 1:
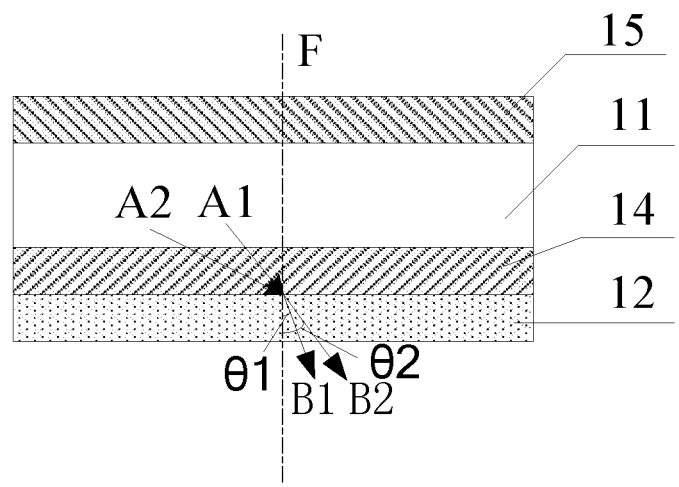
FIG. 1 is a cross-sectional view of an organic light-emitting diode according to a first embodiment of the present disclosure.

This embodiment provides an OLED, as illustrated in FIG. 1, the OLED includes: an organic light-emitting layer 11, and the OLED further includes a first light ray adjusting layer (e.g., a first anisotropic layer) 12. Light ray A generated from the organic light-emitting layer 11 enters the first anisotropic layer 12 to form a refraction angle $\theta$. As the refraction angle $\theta$ increases, a first refractive index of the first anisotropic layer 12 increases. The light generated from the organic light-emitting layer is blue, for example.

For example, the organic light-emitting layer is configured to generate at least a first incident light ray A1 and a second incident light ray A2. After the first incident light ray A1 is incident on the first light ray adjusting layer 12, a first refracted light ray B1 is formed, and after the second incident light ray A2 is incident on the first light ray adjusting layer 12, a second refracted light ray B2 is formed. The refraction angle $\theta 1$ of the first refracted light ray B1 is smaller than the refraction angle $\theta 2$ of the second refracted light ray B2. A first refractive index of the first light ray adjusting layer 12 on a propagation path of the second refracted light ray B2 is greater than the first refractive index of the first light ray adjusting layer 12 on a propagation path of the first refracted light ray B1.

Herein, the "first" of the first anisotropic layer 12 only serves to distinguish it from the second anisotropic layer in the following embodiments. The "first" of the first refraction angle $\theta 1$ and the "second" of the second refraction angle $\theta 2$ are used only for the sake of distinction from the third and fourth refraction angles in the embodiments described below. The "first" of the first refractive index only serves to distinguish it from the second refractive index in the following embodiments.

The light ray A1 generated from the organic light-emitting layer 11 is emitted toward the first anisotropic layer 12. The light ray A1 is refracted when passing through the first anisotropic layer 12 to form a refracted light ray B1. An included angle between the refracted light ray B1 and a normal line F of a surface where the first anisotropic layer 12 is located is the first refraction angle $\theta 1$.

The light ray A2 generated from the organic light-emitting layer 11 is emitted toward the first anisotropic layer 12. The light ray A2 is refracted when passing through the first anisotropic layer 12 to form a refracted light ray B2. An included angle between the refracted light ray B2 and the normal line F of a surface where the first anisotropic layer 12 is located is the second refraction angle $\theta 2$.

According to an optical cavity length calculation formula: $L = H \times \cos\theta \times n1$, where n1 refers to a first refractive index of the first anisotropic layer 12, H refers to a thickness of the first anisotropic layer, L refers to an optical cavity length. As the refraction angle $\theta$ increases, cos $\theta$ decreases. Because cos $\theta$ multiplies by n1, if the first refractive index n1 of the first anisotropic layer also increases, the increase in n1 can reduce the decrease of the optical cavity length caused by the increase of $\theta$, thus reducing the attenuation of blue light intensity and alleviating color cast.

In the above-mentioned embodiment, the OLED can further include: a first electrode 14 and a second electrode 15. The organic light-emitting layer 11 is located between the first electrode 14 and the second electrode 15. The first anisotropic layer 12 is located on a side of the first electrode 14 facing away from the organic light-emitting layer 11.

In this embodiment, by forming the first anisotropic layer 12 on the side of the first electrode 14 facing away from the organic light-emitting layer 11, all the light ray A generated from the organic light-emitting layer 11 can be refracted by the first anisotropic layer 12, so that all the light rays enter the first anisotropic layer 12. When the refraction angle $\theta$ increases, the attenuation of the blue light intensity can be alleviated, and thus the problem of color cast can be effectively alleviated.

The first electrode 14 can be a transparent anode, and the second electrode 15 can be a light-shielding cathode. The OLED thus formed is an OLED of bottom-emitting type. In addition, the first electrode 14 can be a transparent cathode, and the second electrode 15 can be a light-shielding anode. The OLED thus formed is an OLED of top-emitting type.

In the above-mentioned embodiments, the first anisotropic layer 12 has a first opening formed in a central portion thereof.

Figure 2:
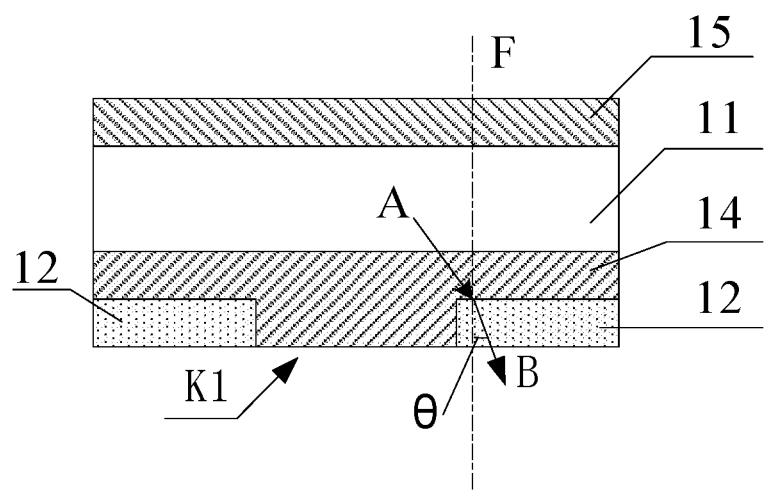
FIG. 2 is a cross-sectional view of another organic light-emitting diode according to the first embodiment of the present disclosure.

For example, as illustrated in FIG. 2, the first anisotropic layer 12 is formed with a first opening K1 in a central portion thereof so as to partially cover a base substrate 13. Because most of the light rays emitted from the central portion and finally entering eyes of a viewer in front of the display device composed of the plurality of OLEDs has a refraction angle θ of 0°. The blue light intensity of the light rays with the first refraction angle θ of 0° is strongest, and the attenuation of the blue light intensity of a small amount of light rays with a refraction angle θ of non-zero has a small effect on the blue light intensity of the light emitted from the central portion, which cannot reach an recognition degree of human eyes, therefore, the anisotropic layer is not formed in the central portion to form the first opening K1, so that the usage amount of the anisotropic layer material can be reduced and the light transmittance of the OLED can also be improved.

Figure 9A:
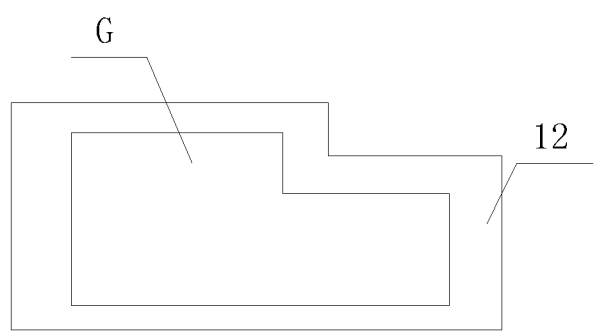
FIG. 9a and FIG. 9b illustrate two forms of a central portion of the first anisotropic layer in the first and second embodiments of the present disclosure.
Figure 9B:
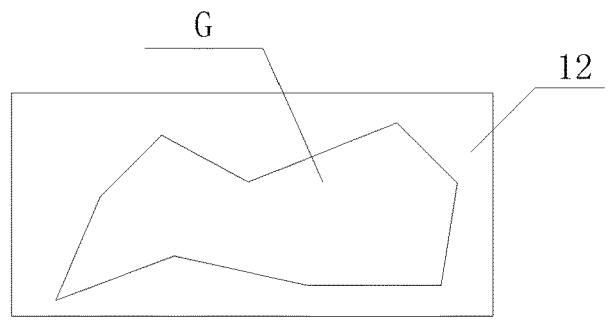

The central portion in the above-mentioned embodiment can correspond to an area in the light-emitting area of the organic light-emitting layer 11 where the attenuation of blue light intensity is not obvious and can correspond to a substantially central region surrounded by an edge of the light-emitting area. The central portion is not limited to a central portion in geometry, nor is the central portion limited to a center of a light-emitting area, nor is the central portion limited to a particular shape. Illustratively, the central portion cart be as illustrated in FIGS. 9a and 9b. It can be understood that, based on the solution, a person skilled in the art can adjust the size, shape, position and the like of the central portion as needed, and the new solution formed also belongs to the protection scope of the present disclosure.

FIGS. 9a and 9b illustrate two types of the central portion U of the first anisotropic layer 12. As illustrated in FIG. 9a, the central portion G of the first anisotropic layer 12 can be a notched rectangle corresponding to the light-emitting area. As illustrated in FIG. 9b, the central portion U of the first anisotropic layer 12 can be an irregular shape corresponding to the light-emitting area.

The first opening K1 described above is formed in the central portion G The number of the first opening K1 is not limited to one as illustrated in FIG. 2, it can also be plural.

When an observer is not facing the display device directly, but standing at a certain angle away from a center of the display device, most of the light rays entering the human eyes are light rays with non-zero refraction angles θ. As illustrated in FIG. 2, a part of the light rays A whose refraction angle θ is non-zero is refracted by the first anisotropic layer 12 to form a refracted light ray B, and an included angle between the refracted light ray B and a normal line F of a surface where the first anisotropic layer is located is the refracted angle θ.

According to an optical cavity length calculation formula: $L=H \times \cos\theta \times n1$, where n1 refers to a first refractive index of the first anisotropic layer, H refers to a thickness of the first anisotropic layer, L refers to an optical cavity length. As the refraction angle θ increases, cos θ decreases. Because cos θ multiplies by n1 if the first refractive index n1 of the first anisotropic layer also increases, the increase in n1 can reduce the decrease of the optical cavity length caused by the increase of θ, which in turn reduce attenuation of the blue light intensity. Therefore, the attenuation of the blue light intensity in the refracted light ray B with the refraction angle θ of non-zero is alleviated, so that the blue light intensity attenuation of the light with the refraction angle θ of non-zero as a whole is alleviated, thereby alleviating color cast problem of an OLED.

It should be noted that the size of the first opening K1 of the first anisotropic layer 12 can be selected according to the principles of minimizing blocking of the refracted light rays B with a refraction angle θ of 0° to the greatest extent and reducing light intensity attenuation of blue light-emitting diode, which is not limited herein.

In the above-mentioned embodiment, the OLED can further include a pixel defining layer. The pixel defining layer is disposed between the organic light-emitting layer 11 and the first electrode 14.

Figure 3:
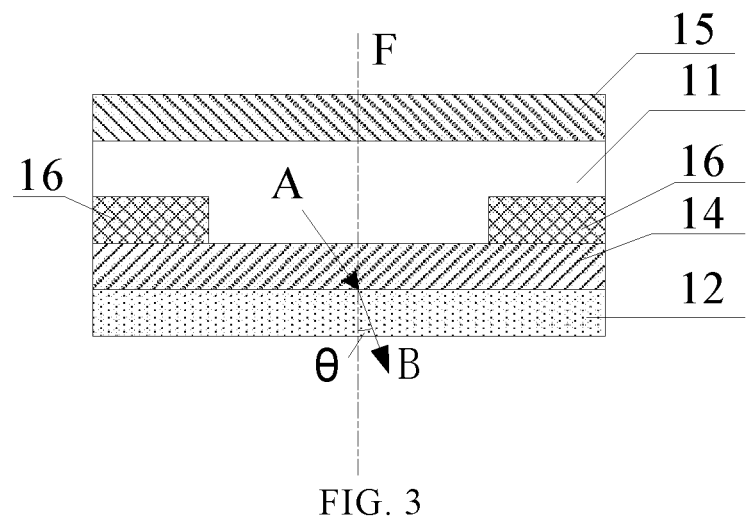
FIG. 3 is a cross-sectional view of still another organic light-emitting diode according to the first embodiment of the present disclosure.

For example, as illustrated in FIG. 3, a pixel defining layer 16 made of opaque material can be disposed between the organic light-emitting layer 11 and the first electrode 14, so as to space apart adjacent pixels formed with a plurality of OLEDs of different colors. FIG. 3 only illustrates the case where the first opening is not formed on the first anisotropic layer 12, but the disclosure is not limited thereto, and the first anisotropic layer 12 in FIG. 3 can also be the case as illustrated in FIG. 2 where a first opening K1 is formed in the central portion.

In the above-mentioned embodiment, the first anisotropic layer 12 can have a thickness ranging from 500 Å to 1000 Å. In this case, change property of the refractive index of the first anisotropic layer 12 can be improved.

In addition, in the above-mentioned embodiment, for example, the light incident on the first light ray adjusting layer 12 enters the first light ray adjusting layer 12 and then has a refraction angle θ (including the first and second refraction angles θ1 and θ2); in a case that the refraction angle θ ranges from 0° to 45° the first refractive index n1 of the first anisotropic layer 12 can range from 1.5 to 1.9. For example, the first refractive index n1 of the first anisotropic layer 12 on the propagation path of the refracted light ray with the refraction angle θ of 0° is set as 1.5; for example, the first refractive index n1 of the first anisotropic layer 12 on the propagation path of the refracted light ray with the refraction angle θ of 45° is set as 1.9. The first refractive index n1 changes continuously between 1.5 and 1.9 when the refraction angle θ is between 0° and 45°.

The refraction angle θ herein refers to an included angle between a refracted light ray (e.g., refracted light ray B) and the normal line F of a surface where the first anisotropic layer 12 is located. The first refractive index n1 is an absolute refractive index of the first anisotropic layer 12.

For example, setting the first refractive index n1 of the first anisotropic layer 12 to be 1.9 on the propagation path of the refracted light ray with the refraction angle θ of 45° can effectively reduce attenuation of light intensity of the blue light.

The OLED provided in this embodiment includes the first anisotropic layer. Light generated from the organic light-emitting layer enters the first anisotropic layer to form a refracted light. An included angle between the refracted light and a normal line of a surface where the first anisotropic layer is located is a refraction angle θ. According to an optical cavity length calculation formula: $L=H \times \cos\theta \times n1$, where n1 refers to a first refractive index of a first anisotropic layer, H refers to a thickness of the first anisotropic layer, L refers to an optical cavity length. As the refraction angle θ increases, cos θ decreases. Because cos θ multiplies by n1, if the first refractive index n1 of the first anisotropic layer at corresponding position also increases, the increase in n1 can reduce the decrease of the optical cavity length caused by the increase of θ, thus reducing the attenuation of blue light intensity and alleviating color cast.

Second Embodiment

Figure 4:
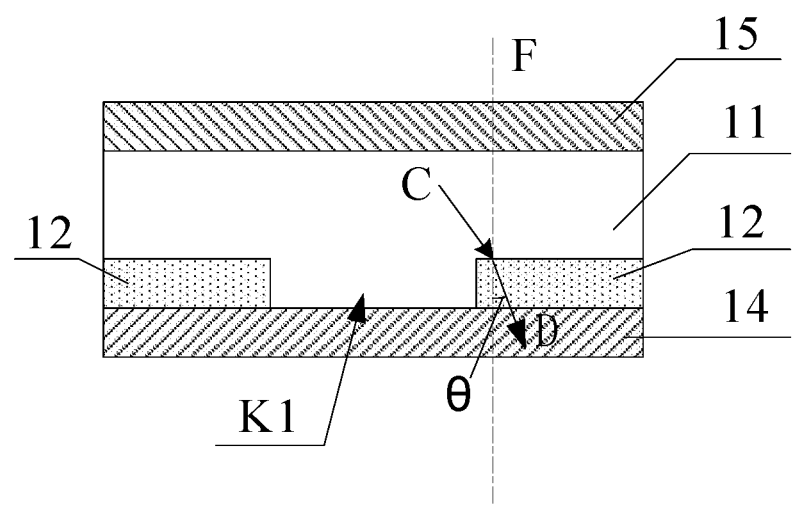
FIG. 4 is a cross-sectional view of an organic light-emitting diode according to a second embodiment of the present disclosure.

This embodiment provides an OLED, as illustrated in FIG. 4, includes an organic light-emitting layer 11, the OLED further includes a first anisotropic layer 12. When a refraction angle θ formed by a light ray C generated from the organic light-emitting layer 11 and entering the first anisotropic layer 12 increases, the first refractive index of the first anisotropic layer 12 increases. The OLED further includes a first electrode 14 and a second electrode 15. The organic light-emitting layer 11 is located between the first electrode 14 and the second electrode 15. The first anisotropic layer 12 is located between the first electrode 14 and the organic light-emitting layer 11, the first anisotropic layer 12 is formed with a first opening K1 in a central portion.

The light ray C is refracted when passing through the first anisotropic layer 12 to form a first refracted light ray D. An included angle between the refracted light ray D and a normal line F of a surface where the first anisotropic layer 12 is located is a refraction angle θ.

The difference between this embodiment and the embodiment as illustrated in FIG. 2 is the positional relationship between the first electrode 14 and the first anisotropic layer 12. In this embodiment, the first anisotropic layer 12 is formed between the first electrode 14 and the organic light-emitting layer 11, and the first opening K1 is formed.

The central portion in the above-mentioned embodiment can correspond to an area in the light-emitting area of the organic light-emitting layer 11 where the attenuation of blue light intensity is not obvious and can correspond to a substantially central region surrounded by an edge of the light-emitting area. The central portion is not limited to a central portion in geometry, nor is the central portion limited to a center of a light-emitting area, nor is the central portion limited to a particular shape. Illustratively, the central portion can be as illustrated in FIGS. 9a and 9b. It can be understood that, based on the solution, a person skilled in the art can adjust the size, shape, position and the like of the central portion as needed, and the new solution formed also belongs to the protection scope of the present disclosure.

FIGS. 9a and 9b illustrate two types of the central portion G of the first anisotropic layer 12. As illustrated in FIG. 9a, the central portion G of the first anisotropic layer 12 can be a notched rectangle corresponding to the light-emitting area. As illustrated in FIG. 9b, the central portion G of the first anisotropic layer 12 can be an irregular shape corresponding to the light-emitting area shape.

The first opening K1 described above is formed in the central portion G; the number of the first opening K1 is not limited to one as illustrated in FIG. 2, it can also be plural.

Similar to the embodiment as illustrated in FIG. 2, in the light generated from the organic light-emitting layer 11 in FIG. 4, a part of light rays C with non-zero first refraction angles θ1 enter into the first anisotropic layer 12 to form the first refracted light D. The first refracted light D and the normal line F of a surface where the first anisotropic layer 12 is located form the first refraction angle θ1. According to an optical cavity length calculation formula: L=H×cos θ1×n1, where n1 refers to a first refractive index of a first anisotropic layer, H refers to a thickness of the first anisotropic layer, L refers to an optical cavity length. As the refraction angle θ increases, cos θ decreases. Because cos θ multiplies by n1, if the first refractive index n1 of the first anisotropic layer also increases, the increase in n1 can reduce the decrease of the optical cavity length caused by the increase of θ, thus reducing the attenuation of blue light intensity and alleviating color cast.

In this embodiment, the first anisotropic layer 12 with the first opening K1 between the organic light-emitting layer 11 and the first electrode 14 is formed, thereby not only reducing the usage amount of the anisotropic layer material but also increasing light transmittance of light with a first refraction angle θ1 of 0° of the OLED, and further ensuring sufficient contact area between the first electrode 14 and the organic light-emitting layer.

In practical applications, the size of the first opening K1 of the first anisotropic layer 12 can be selected according to the principles of minimizing blocking of the refracted light ray B with a refraction angle θ of 0° to the greatest extent, ensuring sufficient contact area between the first electrode 14 and the organic light-emitting layer, and reducing attenuation of the light intensity of blue light-emitting diode, which is not limited to herein.

The first electrode 14 can be a transparent anode, and the second electrode 15 can be a light-shielding cathode. The OLED thus formed is an OLED of bottom-emitting type. In addition, the first electrode 14 can be a transparent cathode, and the second electrode 15 can be a light-shielded anode. The OLED thus formed is an OLED of top-emitting type.

Figure 5:
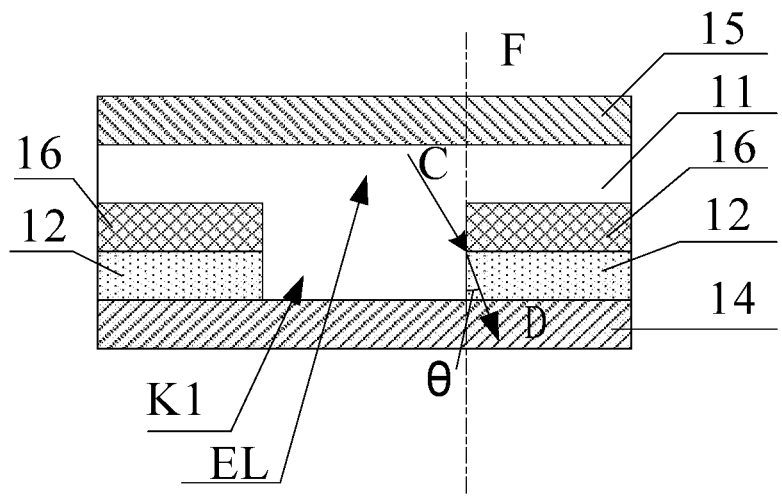
FIG. 5 is a cross-sectional view of another organic light-emitting diode according to the second embodiment of the present disclosure.

In the above-mentioned embodiment, as illustrated in FIG. 5, the OLED can further include a pixel defining layer 16 located between the organic light-emitting layer 11 and the first anisotropic layer 12. The pixel defining layer 16 defines a light-emitting area.

By providing the pixel defining layer 16 between the organic light-emitting layer 11 and the first anisotropic layer 12, adjacent pixels formed by using a plurality of OLEDs of different colors can be spaced apart.

In the above-mentioned embodiment, as illustrated in FIG. 5, an orthographic projection of the first anisotropic layer 12 on the first electrode 14 coincides with an orthographic projection of the pixel defining layer 16 on the first electrode 14.

By setting the sizes of the pixel defining layer 16 and the first anisotropic layer 12, it is possible to achieve that the orthographic projection of the first anisotropic layer 12 on the first electrode 14 coincides with the orthographic projection of the pixel defining layer 16 on the first electrode 14. That is, the first anisotropic layer 12 is located directly below the pixel defining layer 16 and has the same size as the pixel defining layer 16. Because the pixel defining layer 16 is made of a light-shielding material, a part of the light generated from the organic light-emitting layer 11 cannot pass through the pixel defining layer 16 to arrive at the first anisotropic layer 12 below the pixel defining layer 16. At an edge of the first anisotropic layer 12, a part of the light ray C with a non-zero refraction angle θ enters the first anisotropic layer 12 to generate the first refracted light ray D. By the action of the first anisotropic layer 12, the problem of color cast can be reduced; simultaneously, the usage amount of the anisotropic layer material can be reduced, a sufficient contact area between the first electrode 14 and the organic light-emitting layer 11 can be ensured, and light transmittance as greater as possible can be further ensured.

In the above-mentioned embodiment, a thickness of the first anisotropic layer 12 can be 500 Å to 1000 Å. This arrangement makes it possible to improve change property of the first refractive index n1 of the anisotropic layer 12.

In addition, in the above-mentioned embodiment, for example, when the refraction angle θ ranges from 0° to 45°, the first refractive index n1 of the first anisotropic layer can range from 1.5 to 1.9. The first refractive index n1 of the first anisotropic layer 12 on the propagation path of the refracted light ray with the refraction angle θ of 0° is set to be 1.5; for example, the first refractive index n1 of the first anisotropic layer 12 on the propagation path of the refracted light ray with the refraction angle θ of 45° is set to be 1.9. The first refractive index changes continuously between 1.5 and 1.9 with a Change of the refraction angle θ between 0° and 45°.

The angle of refraction angle θ herein refers to an included angle θ between the first refracted light ray D and the normal line F of a surface where the first anisotropic layer 12 is located. This first refractive index n1 is an absolute refractive index of the first anisotropic layer 12.

For example, setting the first refractive index n1 of the first anisotropic layer 12 on the propagation path of the refracted light having the refraction angle θ of 45° to 1.9 can effectively reduce the attenuation of the blue light intensity.

The OLED provided in this embodiment includes the first anisotropic layer. Light generated from an organic light-emitting layer enters a first anisotropic layer to form a refracted light. An included angle between the refracted light and the normal line of the surface where the first anisotropic layer is located is a refraction angle θ1. According to an optical cavity length calculation formula: $L=H \times \cos \theta_1 \times n_1$, where n1 refers to a first refractive index of a first anisotropic layer, H refers to a thickness of the first anisotropic layer, L refers to an optical cavity length. As the refraction angle θ increases, cos θ decreases, Because cos θ multiplies by n1, if the first refractive index n1 of the first anisotropic layer at corresponding position also increases, the increase in n1 can reduce the decrease of the optical cavity length caused by the increase of θ, thus reducing the attenuation of blue light intensity and alleviating color cast.

Third Embodiment

Figure 6:
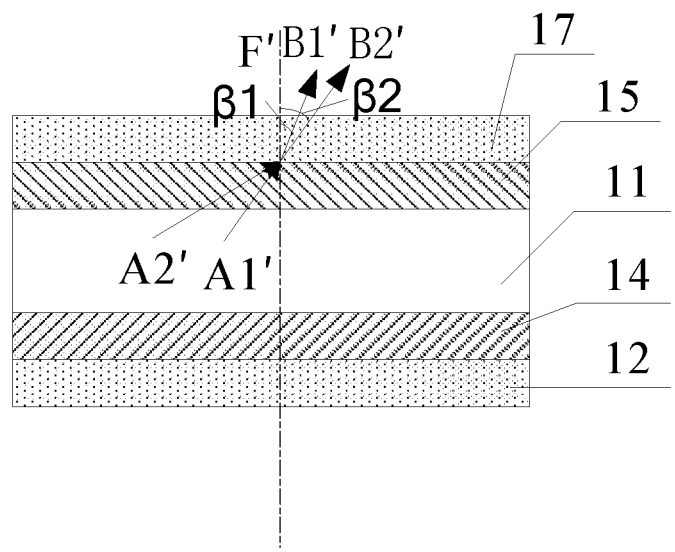
FIG. 6 is a cross-sectional view of an organic light-emitting diode according to a third embodiment of the present disclosure.

This embodiment is an improvement of the first embodiment and the second embodiment. In this embodiment, the first electrode 14 and the second electrode 15 can be both made of a transparent material. The OLED thus formed is a transparent OLED, as illustrated in FIG. 6. In this case, the OLED can further include a second light ray adjusting layer (e.g., a second anisotropic layer) 17. The light ray generated from the organic light-emitting layer 11 enters the second anisotropic layer 17 to form a second refraction angle β; as the second refraction angle β increases, the second refractive index of the second anisotropic layer 17 increases.

For example, a third light ray A1' generated from the organic light-emitting layer 11 enters the second anisotropic layer 17 to form a third refracted light ray B1', and an included angle of the third refracted light ray B1' and a normal line F' of a surface where the second anisotropic layer 17 is located is a third refraction angle β1.

A fourth light ray A2' generated from the organic light-emitting layer 11 enters the second anisotropic layer 17 to form a fourth refracted light ray B2', and an included angle between the fourth refracted light ray B2' and the normal line F' of the surface where the second anisotropic layer 17 is located is a fourth refraction angle β2.

The second anisotropic layer 17 is located, for example, on a side of the second electrode 15 facing away from the organic light-emitting layer 11.

The refraction angle β1 of the third refracted light ray B1' is smaller than the refraction angle β2 of the fourth refracted light ray B2'. The second refractive index of the second light ray adjusting layer 17 on the propagation path of the fourth refracted light ray B2' is greater than that of the second light ray adjusting layer 17 on the propagation path of the third refracted light ray B1'.

The second anisotropic layer 17 herein plays the same role as the first anisotropic layer 12, that is, when the light ray A' generated from the organic light-emitting layer 11 enters the second anisotropic layer 17 to generate the refracted light ray B', attenuation of blue light in the second refracted light with non-zero second refraction angle β is alleviated.

For example, according to an optical cavity length calculation formula: $L=H' \times \cos \beta \times n_2$, where n2 refers to a second refractive index of a second anisotropic layer 17, H' refers to a thickness of the second anisotropic layer, L refers to an optical cavity length. As the refraction angle β increases, cost decreases, Because cos β multiplies by n2, if the first refractive index n2 of the second anisotropic layer 17 also increases, the increase in n2 can reduce the decrease of the optical cavity length caused by the increase of thus reducing the attenuation of blue light intensity and alleviating color cast.

Figure 7:
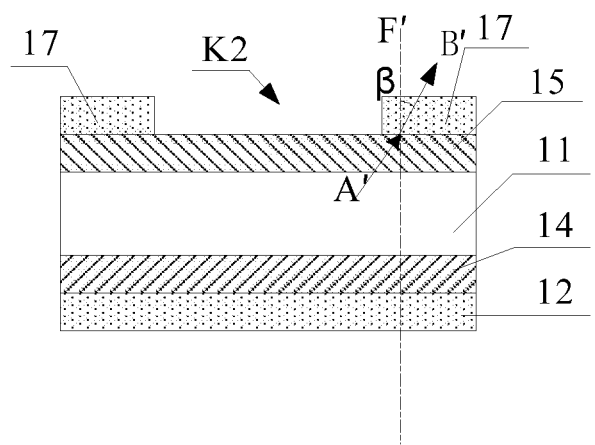
FIG. 7 is a cross-sectional view of another organic light-emitting diode according to the third embodiment of the present disclosure.

Similar to the first anisotropic layer 12 in the first embodiment, as illustrated in FIG. 7, the second anisotropic layer 17 can also be formed with a second opening K2 in an central portion thereof, which can reduce the usage amount of the anisotropic layer material on one hand, it is also possible to increase light transmittance when the second refraction angle β is 0° on the other hand.

Figure 9C:
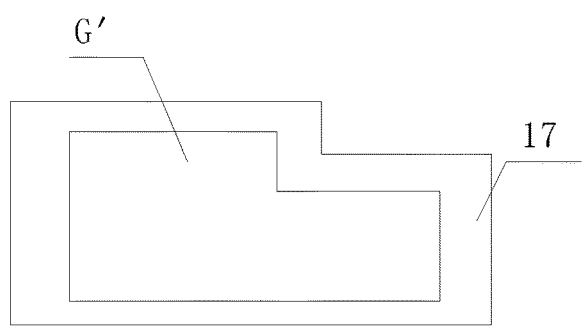
FIG. 9c and FIG. 9d illustrate two forms of a central portion of the second anisotropic layer in the third and fourth embodiments of the present disclosure.
Figure 9D:
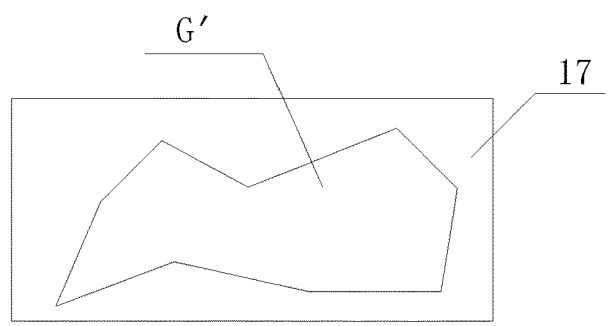

The central portion in the above-mentioned embodiment can correspond to an area in the light-emitting area of the organic light-emitting layer 11 where the attenuation of blue light intensity is not obvious and can correspond to a substantially central region surrounded by an edge of the light-emitting area. The central portion is not limited to a central portion in geometry, nor is the central portion limited to a center of a light-emitting area, nor is the central portion limited to a particular shape. Illustratively, the central portion can be as illustrated in FIGS. 9c and 9d. It can be understood that, based on the solution, a person skilled in the art can adjust the size, shape, position and the like of the central portion as needed, and the new solution formed also belongs to the protection scope of the present disclosure.

FIGS. 9c and 9d illustrate two types of the central portion G' of the second anisotropic layer 17. As illustrated in FIG. 9c, the central portion G' of the second anisotropic layer 17 can be a notched rectangle corresponding to the light-emitting area. As illustrated in FIG. 9d, the central portion G' of the second anisotropic layer 17 can be an irregular shape corresponding to the light-emitting area.

The above-mentioned second opening K2 is formed in the central portion G'; the number of the second opening K2 is not limited to one as illustrated in FIG. 7, it can also be plural.

The attenuation of the blue light intensity of the refracted light ray B' with a non-zero refraction angle β can be reduced by the action of the second anisotropic layer 17.

In addition, the size of the second opening K2 of the second anisotropic layer 17 can be practically implemented in a manner that minimizes blocking of the refracted light ray B' whose second refraction angle is 0° to the greatest extent and alleviates the light intensity attenuation of the blue light-emitting diode, which is not limited thereto.

FIGS. 6 and 7 only illustrate that the first anisotropic layer 12 is located on the side of the first electrode 14 facing away from the organic light-emitting layer 11 and the first anisotropic layer 12 does not have a first opening formed in the central portion. As described in first embodiment, the first anisotropic layer 12 can also have a first opening K1. In addition, as described in the second embodiment, the first anisotropic layer 12 can be located between the first electrode 14 and the organic light-emitting layer 11, and the first anisotropic layer also has the first opening K1. In the OLED provided in this embodiment, the pixel defining layer as described in the first embodiment or the second embodiment can also be provided. These embodiments can refer to FIG. 2 to FIG. 5, which are not illustrated herein again.

The transparent OLED provided by this embodiment adds a second anisotropic layer on the base of the first embodiment and the second embodiment, and the second anisotropic layer has the same property as the first anisotropic layer; the first anisotropic layer and the second anisotropic layer are respectively disposed on both sides of the organic light-emitting layer. Light generated from the organic light-emitting layer enters the second anisotropic layer to form a second refracted light, and an included angle between the second refracted light and a normal line of a surface where the second anisotropic layer is located is a refraction angle $\beta$. According to an optical cavity length calculation formula: $L=H'\times\cos\beta\times n2$, where n2 refers to a second refractive index of a second anisotropic layer 17, H' refers to a thickness of the second anisotropic layer, L refers to an optical cavity length. As the refraction angle $\beta$ increases, $\cos\beta$ decreases. Because $\cos\beta$ multiplies by n2, if the first refractive index n2 of the second anisotropic layer also increases, the increase in n2 can reduce the decrease of the optical cavity length caused by the increase of $\beta$, thus reducing the attenuation of blue light intensity and further alleviating color cast.

Fourth Embodiment

Figure 8:
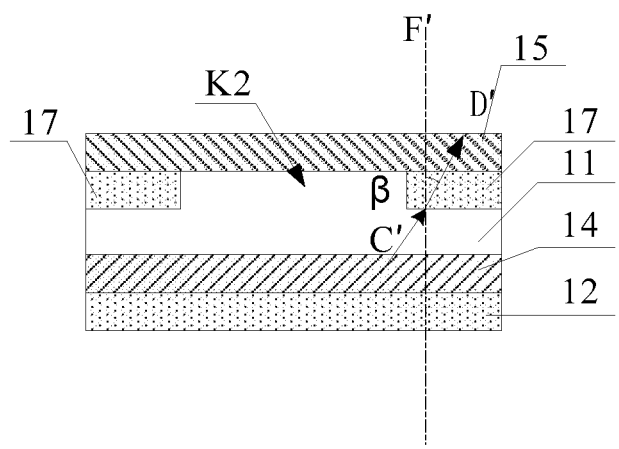
FIG. 8 is a cross-sectional view of an organic light-emitting diode according to a fourth embodiment of the present disclosure.

This embodiment is another improvement of the first embodiment and the second embodiment. In this embodiment, both the first electrode 14 and the second electrode 15 are made of a transparent material, as illustrated in FIG. 8. The OLED thus formed is a transparent OLED. In this case, the OILED further includes a second anisotropic layer 17A. A light ray C' generated from the organic light-emitting layer enters the second anisotropic layer 17 to form a refraction angle $\beta$; as the refraction angle $\beta$ increases, a second refractive index of the second anisotropic layer 17 increases.

For example, light ray C' generated from the organic light-emitting layer enters the second anisotropic layer 17 to form a refracted light ray D', and an included angle between the second refracted light ray D' and a normal line F' of a surface where the second anisotropic layer 17 is located is the refraction angle $\beta$.

The second anisotropic layer 17 is located between the second electrode 15 and the organic light-emitting layer 11, and the second anisotropic layer 17 is formed with a second opening K2 in an central portion.

In the above-mentioned embodiment, the central portion can correspond to an area in the light-emitting area of the organic light-emitting layer 11 where the attenuation of blue light intensity is not obvious; the central portion can correspond to a substantially central region surrounded by an edge of the light-emitting area. The central portion is not limited to a central portion in geometry, nor is the central portion limited to a center of a light-emitting area, nor is the central portion limited to a particular shape. Illustratively, the central portion can be as illustrated in FIGS. 9c and 9d. It can be understood that, based on the solution, a person skilled in the art can adjust the size, shape, position and the like of the central portion as needed, and the new solution formed also belongs to the protection scope of the present disclosure.

FIGS. 9c and 9d illustrate two versions of the central portion G' of the second anisotropic layer 17. As illustrated in FIG. 9c, the central portion of the second anisotropic layer 17 can be a notched rectangle corresponding to the light-emitting area. As illustrated in FIG. 9d, the central portion G' of the second anisotropic layer 17 can be an irregular shape corresponding to the light-emitting area.

The above-mentioned second opening K2 is formed in the central portion G'; the number of the second opening K2 is not limited to one as illustrated in FIG. 8, can also be plural.

The second anisotropic layer 17 herein plays the same role as the first anisotropic layer 12; when the light ray C' generated from the organic light-emitting layer 11 enters the second anisotropic layer 17 to generate the second refracted light ray D', the blue light attenuation of the second refracted light ray D' with non-zero second refraction angle $\beta1$ is alleviated.

For example, according to an optical cavity length calculation formula: $L=H'\times\cos\beta1\times n2$, where n2 refers to a second refractive index of a second anisotropic layer 17, H' refers to a thickness of the second anisotropic layer, L refers to an optical cavity length. As the refraction angle $\beta$ increases, $\cos\beta$ decreases. Because $\cos\beta$ multiplies by n2, if the first refractive index n2 of the second anisotropic layer also increases, the increase in n2 can reduce the decrease of the optical cavity length caused by the increase of $\beta1$, thus reducing the attenuation of blue light intensity and further alleviating color cast.

Similar to the second embodiment, the second anisotropic layer 17 has a second opening K2 in an central portion thereof, which can not only reduce the usage amount of the anisotropic layer material but also increase light transmittance of the second refracted light ray D' whose refraction angle $\beta$ is non-zero, and further ensure sufficient contact area between the second electrode material and the organic light-emitting layer.

In addition, the size of the opening of the second anisotropic layer 17 can be selected in practical application to minimize blocking of the second refracted light D' whose refraction angle $\beta1$ is 0° the greatest extent and alleviate the light intensity attenuation of the blue light of the OLED, which is no limited herein.

FIG. 8 only illustrates that the first anisotropic layer 12 is located on the side of the first electrode facing away from the organic light-emitting layer 11 and the first anisotropic layer 12 does not have a first opening in the central portion. As described in the first embodiment, the first anisotropic layer 12 can also have a first opening K1. In addition, as described in the second embodiment, the first anisotropic layer 12 can be located between the first electrode 14 and the organic light-emitting layer 11, and the first anisotropic layer has the first opening K1. In the OLED provided in this embodiment, the pixel defining layer as described in the first or second embodiment can also be provided. These embodiments can refer to FIG. 2 to FIG. 5, which are not illustrated herein again.

The transparent OLED according to the present embodiment adds a second anisotropic layer on the base of the first and second embodiments, and the second anisotropic layer has the same property as the first anisotropic layer; the first anisotropic layer and the second anisotropic layer are respectively disposed on both sides of the organic light-emitting layer. A light ray generated from the organic light-emitting layer enters the second anisotropic layer to form a refracted light. An included angle between the refracted light and a normal line of a surface where the second anisotropic layer is located is a refraction angle $\beta$. According to an optical cavity length calculation formula: $L=H'\times\cos\beta\times n2$, where n2 refers to a second refractive index of a second anisotropic layer, H' refers to a thickness of the second anisotropic layer, F refers to an optical cavity length. As the refraction angle $\beta$ increases, $\cos\theta$ decreases. Because cos β multiplies by n2, if the first refractive index n2 of the second anisotropic layer also increases, the increase in n2 can reduce the decrease of the optical cavity length caused by the increase of β, thus reducing the attenuation of blue light intensity and alleviating color cast.

Fifth Embodiment

Figure 10:
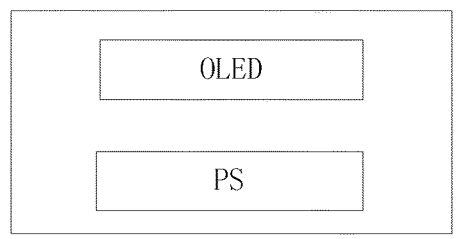
FIG. 10 is a schematic diagram of a display device provided in a fifth embodiment of the present disclosure.

The present embodiment provides a display device. Referring to FIG. 10, the display device includes any one of the OLEDs as described in the first to fourth embodiments and a package substrate PS.

In the display device provided in this embodiment, because the OLEDs described in the above-mentioned embodiments are used, it is possible to reduce the decrease of the optical cavity length in a case that the refraction angle is increased, so as to reduce the attenuation of the blue light intensity of the refracted light, and then alleviate the color cast problem.

In the foregoing description of the embodiments, the features, structures, materials, or characteristics can be combined in any suitable manner in any one or more of the embodiments or examples.

What have been described above are only specific implementations of the present disclosure, the protection scope of the present disclosure is not limited thereto. Any changes or substitutions easily occur to those Skilled in the art within the technical scope of the present disclosure should be covered in the protection scope of the present disclosure. Therefore, the protection scope of the present disclosure should be based on the protection scope of the claims.

In order to make objects, technical details and advantages of the embodiments of the disclosure apparent, the technical solutions of the embodiments will be described in a clearly and fully understandable way in connection with the drawings related to the embodiments of the disclosure. Apparently, the described embodiments are just a part but not all of the embodiments of the disclosure. Based on the described embodiments herein, those skilled in the art can obtain other embodiment(s), without any inventive work, which should be within the scope of the disclosure.

The foregoing is merely exemplary embodiments of the present disclosure, and is not intended to limit the protection scope of the present disclosure. The protection scope of the disclosure is determined by the appended claims.

The application claims priority to the Chinese patent application No. 201611239420.0, filed Dec. 28, 2016, the entire disclosure of which is incorporated herein by reference as part of the present application.

The invention claimed is:

1. An organic light-emitting diode (OLED), comprising:
an organic light-emitting layer and a first light ray adjusting layer,
wherein the organic light-emitting layer is configured to generate at least a first incident light ray and a second incident light ray into the first light ray adjusting layer to form a first refracted light ray and a second refracted light ray respectively, a refraction angle of the first refracted light ray is smaller than that of the second refracted light ray, a first refractive index of the first light ray adjusting layer on a propagation path of the second refracted light ray is greater than that of the first light ray adjusting layer on a propagation path of the first refracted light ray,
the OLED further comprises a first electrode and a second electrode, wherein the organic light-emitting layer is located between the first electrode and the second electrode, the first light ray adjusting layer is located on a side of the first electrode acing away from the organic light-emitting layer,
the OLED further comprises a second light ray adjusting layer,
wherein the organic light-emitting layer is configured to generate at least a third incident light ray and a fourth incident a into the second light ray adjusting layer to form a third refracted light ray and a fourth refracted light ray respectively, a refraction angle of the third refracted light ray is smaller than that of the fourth refracted light ray, and a second refractive index of the second light ray adjusting layer, on a propagation path of the fourth refracted light ray is greater than that of the second light ray adjusting layer on a propagation path of the third refracted, light ray, and the second light ray adjusting layer is located between the second electrode and the organic light-emitting layer.

2. The OLE© according to claim 1, wherein the first light ray adjusting layer is an anisotropic layer.

3. The OLED according to claim 1, further comprising: a pixel defining layer configured to define a light-emitting area of the organic light-emitting layer,
wherein the first light ray adjusting layer is provided with a first opening, and the first opening overlaps a central region of a light-emitting area of the organic light-emitting layer.

4. The OLED according to claim 3, wherein an orthographic projection of the first light ray adjusting layer on the first electrode coincides with an orthographic projection of the pixel defining layer on the first electrode.

5. The OLED according to claim 1, wherein the second light ray adjusting layer is an anisotropic layer.

6. The OLED according to claim 1, wherein the second light ray adjusting layer is provided with a second opening, the second opening overlaps a central region of a light-emitting area of the organic light-emitting layer.

7. The OLED according to claim 6, wherein an orthographic projection of the second light ray adjusting layer on the first electrode coincides with an orthographic projection of the pixel defining layer on the first electrode.

8. The OLED according to claim 1, wherein one of the first electrode and the second electrode is a transparent anode, and the other of the first electrode and the second electrode is a light shielding cathode.

9. The OLED according to 1, wherein both the first electrode and the second electrode are made of a transparent material.

10. The OLED according to claim 1, wherein the first light ray adjusting layer has a thickness of 500 Å to 1000 Å.

11. The OLED according to claim 1, wherein the first refraction angle and the second refraction angle range from 0° to 45°.

12. The OLED according to claim 11, wherein the first refractive index of the first light adjusting layer ranges from 1.5 to 1.9.

13. The OLED according to claim 3, wherein the central region of the light-emitting area of the organic light-emitting layer is a geometric center of the light-emitting area of the organic light-emitting layer.

14. A display device comprising the OLED according to claim 1.

* * * * *